(12) United States Patent
Webster et al.

(10) Patent No.: US 7,417,327 B2
(45) Date of Patent: Aug. 26, 2008

(54) IC CHIP PACKAGE WITH COVER

(75) Inventors: Steven Webster, Miao-li (TW); Ying-Cheng Wu, Miao-li (TW); Kun-Hsieh Liu, Miao-li (TW); Po-Chih Hsu, Miao-li (TW)

(73) Assignee: Altus Technology Inc., Miao-Li Hsien (TW)

( * ) Notice: Subject to any disclaimer, the term of this patent is extended or adjusted under 35 U.S.C. 154(b) by 171 days.

(21) Appl. No.: 11/262,907

(22) Filed: Oct. 31, 2005

(65) Prior Publication Data
US 2006/0097405 A1 May 11, 2006

(30) Foreign Application Priority Data
Nov. 5, 2004 (TW) .............................. 93133742 A

(51) Int. Cl.
H01L 23/48 (2006.01)
H01L 23/52 (2006.01)
H01L 29/40 (2006.01)
H01L 23/02 (2006.01)
H01L 23/12 (2006.01)

(52) U.S. Cl. .................. 257/784; 257/678; 257/680; 257/704; 257/773; 257/774; 257/783

(58) Field of Classification Search .............. 257/678, 257/680, 704, 783–784, 773–774
See application file for complete search history.

(56) References Cited

U.S. PATENT DOCUMENTS

| 5,278,429 | A | * | 1/1994 | Takenaka et al. | ............. 257/678 |
| 5,552,635 | A | * | 9/1996 | Kim et al. | .................... 257/706 |
| 5,554,824 | A | * | 9/1996 | Ueda et al. | ................... 174/551 |
| 5,729,050 | A | * | 3/1998 | Kim | ........................... 257/667 |
| 5,814,883 | A | * | 9/1998 | Sawai et al. | ................. 257/712 |
| 6,117,705 | A | * | 9/2000 | Glenn et al. | ................ 438/106 |
| 6,201,307 | B1 | * | 3/2001 | Terashi et al. | ............... 257/784 |
| 6,396,143 | B1 | * | 5/2002 | Kimbara et al. | ............. 257/712 |
| 6,437,412 | B1 | * | 8/2002 | Higuchi et al. | .............. 257/416 |
| 6,518,501 | B1 | * | 2/2003 | Kawahara et al. | ........... 174/538 |
| 6,528,869 | B1 | * | 3/2003 | Glenn et al. | ................ 257/678 |

(Continued)

FOREIGN PATENT DOCUMENTS

CN 01200427.8 10/2001

*Primary Examiner*—Ida M Soward
(74) *Attorney, Agent, or Firm*—Morris Manning Martin LLP; Tim Tingkang Xia, Esq.

(57) ABSTRACT

An IC (integrated circuit) chip package includes a substrate (2), a chip (3), a plurality of bonding wires (32), and a cover (5). The substrate has a top surface, a bottom surface, a receiving chamber (23) defined therein, a plurality of solder pads (24) arranged around the top surface and the bottom surface, and a plurality of vias (25) having conductive material electrically connecting the top solder pads with the bottom solder pads defined therein. The chip is mounted in the receiving chamber, and has a plurality of chip solder pads arranged around a top surface thereof. The bonding wires respectively electrically connect the top solder pads of the substrate with the chip solder pads. The cover is fastened to the top surface of the substrate to cover the opening, and has a smaller profile than that of the substrate, thereby not cover a peripheral area of the top surface.

18 Claims, 1 Drawing Sheet

U.S. PATENT DOCUMENTS

| | | |
|---|---|---|
| 6,590,269 B1 * | 7/2003 | Chuang et al. ............... 257/432 |
| 6,603,183 B1 * | 8/2003 | Hoffman .................... 257/434 |
| 6,747,346 B2 * | 6/2004 | Saito et al. .................. 257/684 |
| 6,870,238 B2 * | 3/2005 | Exposito et al. ............. 257/431 |
| 2003/0067750 A1 * | 4/2003 | Garcia ........................ 361/702 |
| 2004/0011699 A1 * | 1/2004 | Park ........................... 206/710 |
| 2004/0080044 A1 * | 4/2004 | Moriyama et al. .......... 257/728 |
| 2004/0217454 A1 * | 11/2004 | Brechignac et al. ......... 257/678 |

\* cited by examiner

IC CHIP PACKAGE WITH COVER

CROSS-REFERENCE TO RELATED APPLICATIONS

Relevant subject matter is disclosed in U.S. patent application Ser. No. 11/262,876 entitled "IC CHIP PACKAGE WITH ISOLATED VIAS", recently filed with the same assignee as the instant application. The disclosure of the above identified application is incorporated herein by reference.

FIELD OF THE INVENTION

The present invention relates generally to an IC (integrated circuit) chip package; and more particularly to a small sized IC chip package with isolated vias, and a method for packaging such IC chip package.

BACKGROUND

FIG. 2 illustrates a conventional IC chip package. The IC chip package is constructed to include a substrate 10, a chip 12, a cover 13, and adhesive means 14. The substrate 10 includes a top side 101 and a receiving chamber 102. The substrate 10 defines an opening communicating with the receiving chamber 102 at the top side 101. The top side 101 is provided with a plurality of connecting pads arranged around the opening. The substrate 10 further includes a plurality of plated through holes 103 provided around a periphery thereof, in order to electrically connect the connecting pads at the top of the substrate 10 to a bottom of the substrate 10. The chip 12 is fixedly mounted in the receiving chamber 102. The chip 12 is provided with a plurality of connecting pads respectively electrically connected to the connecting pads of the substrate 10 by means of bonding wires 15. The adhesive means 14 is applied on areas where the bonding wires 15 connect with the connecting pads of the substrate 10. The cover 13 is fixedly fastened to the adhesive means 14, thereby covering the opening of the receiving chamber 102. When the IC chip package is installed on a circuit board, tin solder is applied to bottoms of the through holes 103. The chip 12 is thereby electrically connected to a conductive circuit pattern of the circuit board.

In this IC chip package, it is generally difficult to control the amount of the adhesive means 14 applied. If insufficient adhesive means 14 is used, the cover 13 may not properly adhere to the substrate 10. Over time, tiny gaps may form between the cover 13 and the top side 101 of the substrate 10. If this happens, moisture may penetrate inside the receiving chamber 102 and adversely affect the functioning of the chip 12. In addition, the cover 13 may become detached from the substrate 10, which frequently causes complete failure of the IC chip package. On the other hand, if excessive adhesive means 14 is used, the adhesive means 14 is liable to overflow down along the through holes 103 to the bottom of the substrate 10. If this happens, the adhesive means 14 may form insulating coatings at the bottoms of the through holes 103, which frequently results in the substrate 10 being unable to properly electrically connect with the circuit board. Either way, the quality and/or reliability of the IC chip package is liable to be reduced.

Furthermore, the through holes 103 are exposed to ambient air, and are liable to be affected by oxidation or contamination. This can lead to faulty electrical connection of the substrate 10 with the circuit board.

What is needed, therefore, is an IC chip package having high quality and reliability, and a method for packaging the IC chip package.

SUMMARY

In a preferred embodiment, an IC chip package includes a substrate, a chip, a plurality of bonding wires, and a cover. The substrate includes a top surface, a bottom surface, a receiving chamber having an opening at the top surface, a plurality of solder pads arranged around the top surface and the bottom surface, and a plurality of vias. The bottom solder pads respectively correspond to the solder pads arranged around the top surface. The vias are defined in the substrate, and have conductive material filled therein in order to electrically connect the top solder pads with the bottom solder pads. The chip is mounted in the receiving chamber of the substrate, and includes a plurality of solder pads arranged around a top surface thereof. The bonding wires respectively electrically connect the top solder pads of the substrate and the solder pads of the chip. The cover is fastened to the top surface of the substrate, and covers the opening. The cover has a smaller profile than that of the substrate. A peripheral area of the top surface is not covered by the cover.

A method for packaging the IC chip package includes the steps of: providing a substrate, which comprises a receiving chamber defined therein, a plurality of top solder pads arranged on a top surface of the substrate; providing a chip, gluing the chip to a bottom of the receiving chamber of the substrate, the chip comprising a plurality of solder pads arranged on a top surface thereof, providing a plurality of bonding wires, electrically connecting one end of the bonding wire with a respective solder pad of the chip, and an opposite end of each bonding wire with a respective top solder pad of the substrate; providing adhesive means, applying the adhesive means to each of the bonding wires, and applying the adhesive means to areas where the bonding wires connect with the top solder pads and the chip solder pads; providing a cover, putting the cover on the top surface of the substrate and covering the receiving chamber, whereby a peripheral area of the top surface remains not covered by the cover; and applying adhesive means to sides of the cover and the peripheral area of the top surface not covered by the cover.

Other advantages and novel features will become more apparent from the following detailed description of preferred embodiments when taken in conjunction with the accompanying drawings, in which:

DETAILED DESCRIPTION OF THE PREFERRED EMBODIMENTS

Figure 1:
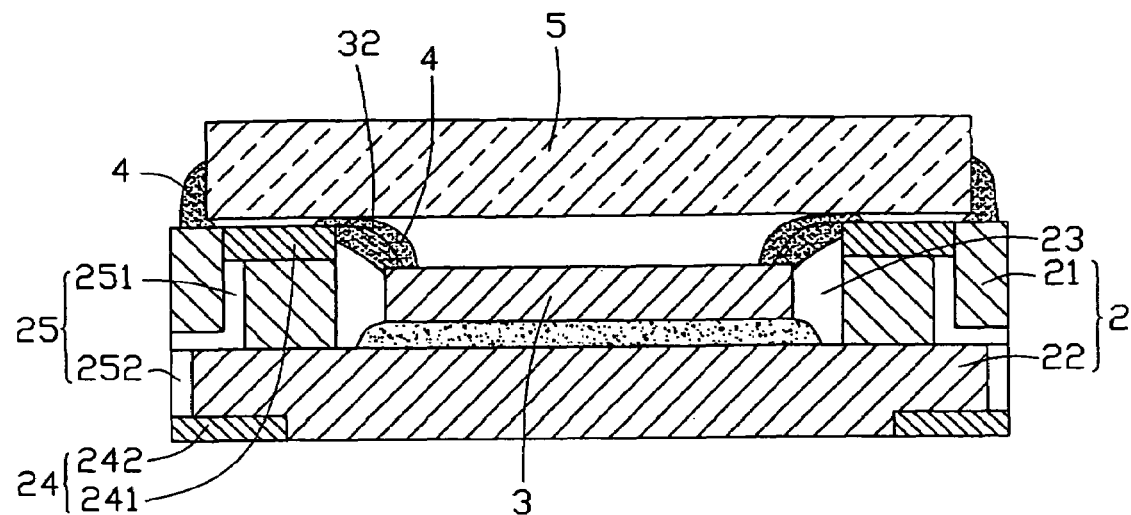
FIG. 1 is a simplified, schematic, cross-sectional view of an IC chip package according to a preferred embodiment of the present invention.
Figure 2:
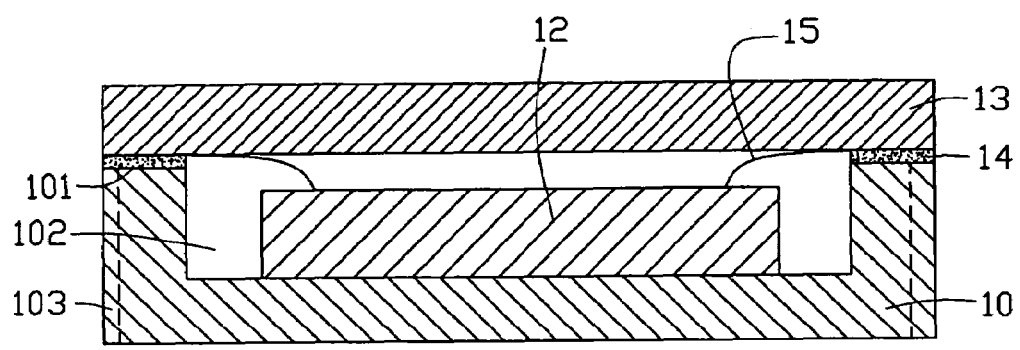
FIG. 2 is a simplified, schematic, cross-sectional view of a conventional IC chip package.

Referring to FIG. 1, an electronic package like an IC chip package in accordance with one embodiment of the present invention is shown. The IC chip package includes a substrate 2, a chip 3, a plurality of bonding wires 32, adhesive means 4, and a cover 5.

The substrate 2 is made of a material such as a ceramic material or a fibrous composite material. The substrate 2 includes a frame substrate 21 and a board substrate 22. The frame substrate 21 is fixedly mounted on a top surface of the board substrate 22 to form the substrate 2. The top surface of the board substrate 22 and an inner wall of the frame substrate 21 cooperatively define a receiving chamber 23 therebetween. The receiving chamber 23 includes an opening at a top surface of the frame substrate 21. The opening communicates with an outside, so that the receiving chamber 23 can receive an electronic component such as the chip 3.

The top surface of the frame substrate 21 and a bottom surface of the board substrate 22 are provided with a plurality of electrical conductors like solder pads 24, in order to electrically connect the chip 3 on the substrate 2 with an electronic component such as a circuit board (not shown). The solder pads 24 include a plurality of top solder pads 241 embedded in a top surface portion of the frame substrate 21. Each top solder pad 241 corresponds to a respective bottom solder pad 242 embedded in a peripheral region of a bottom surface portion of the board substrate 22. An outer end of each top solder pad 241 is spaced a certain distance from an outer wall of the substrate 2.

The substrate 2 has a plurality of vias 25 defined therein. The vias 25 are defined between the top solder pads 241 and the bottom solder pads 242. The vias 25 include a plurality of top via portions 251 defined in the frame substrate 21, and a plurality of bottom via portions 252 defined in the board substrate 22. Each top via portion 251 corresponds to and communicates with a respective bottom via portion 252 when the frame substrate 21 is fixedly mounted on the board substrate 22. A top of each top via portion 251 is covered by a respective top solder pad 241, and a bottom of each bottom via portion 252 is covered by a respective bottom solder pad 242. Each via 25 is filled with or plated with a conductive material, in order to electrically connect the top solder pad 241 with the corresponding bottom solder pad 242. In the illustrated embodiment, each via 25 further includes a horizontal intermediate via portion (not labeled) interconnecting the top via portion 251 with the bottom via portion 252. The intermediate via portion is defined in a bottom surface portion of the frame substrate 21. Alternatively, the intermediate via portion can be defined in a top surface portion of the board substrate 22, or in both the bottom surface portion of the frame substrate 21 and the top surface portion of the board substrate 22. In the illustrated embodiment, each intermediate via portion comprises a termination at the outer wall of the substrate 2.

The chip 3 is glued to the top surface of the board substrate 22 at a bottom of the receiving chamber 23. A peripheral region of a top surface of the chip 3 is provided with a plurality of chip solder pads (not shown).

The bonding wires 32 are made of conductive material such as gold or aluminum alloy. One end of each bonding wire 32 is electrically connected to a respective top solder pad 241 of the substrate 2, and the other end of the bonding wire 32 is electrically connected to a respective chip solder pad of the chip 3.

The adhesive means 4 is applied to the peripheral region of the top surface of the chip 3 to cover areas where the bonding wires 32 connect with the chip solder pads. The adhesive means 4 is further applied to cover the bonding wires 32, and areas where the bonding wires 32 connect with the top solder pads 241. The adhesive means 4 may, for example, be a silicone, epoxy, acrylic, or polyamide adhesive. The adhesive means 4 provides a protective coating for the bonding wires 32, and reinforces the connections of the ends of the bonding wires 32 with the top solder pads 241 and the chip solder pads.

The cover 5 can be an opaque plate member or a transparent plate member. The cover 5 is mounted on the substrate 2, above the chip 3, and is adhered to the adhesive means 4 applied on the top surface of the chip 3. Thus, the cover 5 and the adhesive means 4 applied on the top surface of the chip 3 cooperatively prevent external impact or contamination occurring to the top surface of the chip 3. An outer periphery of the cover 5 has a dimension smaller than that of the outer periphery of the substrate 2. The adhesive means 4 is further applied to sides of the cover 5 and a peripheral area of the top surface of the substrate 2 that is not covered by the cover 5. Thereby, the cover 5 is securely fixed to the top surface of the substrate 2, and the receiving chamber 32 is sealed. The chip 3 is thereby completely protected from external impact or contamination.

A method of packaging the IC chip package includes the steps of:

(1) providing a substrate 2, the substrate 2 having a receiving chamber 23 defined therein, a plurality of top solder pads 241 arranged on a top surface of the substrate 2, and a plurality of bottom solder pads 242 arranged on a bottom surface of the substrate 2 opposite to the top surface, each bottom solder pad 242 corresponding to and electrically connecting with a respective top solder pad 241;

(2) providing a chip 3, gluing the chip 3 to a bottom of the receiving chamber 23 of the substrate 2, the chip 3 having a plurality of solder pads arranged on a top surface thereof;

(3) providing a plurality of bonding wires 32, electrically connecting one end of each bonding wire 32 with a respective solder pad of the chip 3, and an opposite end of the bonding wire 32 with a respective top solder pad of the substrate 2;

(4) providing adhesive means 4, applying the adhesive means 4 on each of the bonding wires 32, and applying the adhesive means 4 to areas where the bonding wires 32 connect with the top solder pads 241 and chip solder pads;

(5) providing a cover 5, putting the cover 5 on a top surface of the substrate 2, and covering an opening of the receiving chamber 23, whereby a peripheral area of the top surface remains not covered by the cover 5; and (6) applying adhesive means 4 to sides of the cover 5 and the peripheral area of the top surface not covered by the cover 5, in order to fix the cover 5 to the substrate 2 and seal the receiving chamber 23.

In the preferred embodiments, it is of advantage that the vias 25 are defined in the substrate 2 and covered by the top solder pads 241 and the bottom solder pads 242. This helps prevent the adhesive means 4 from entering the vias 25. In addition, the vias 25 are isolated from ambient air, so that the conductive material therein is protected from oxidation and contamination. Furthermore, the protective coatings protect the bonding wires 32 from breakage. Moreover, the top solder pads 241 are spaced a certain distance from the outer wall of the substrate 2, and the peripheral area of the top surface of the substrate 2 is not covered by the cover 5. Therefore when the adhesive means 4 is applied to cover the areas where the bonding wires 32 connect with the top solder pads 241, and when the adhesive means 4 is applied to sides of the cover 5, there is minimal risk of excess adhesive means 4 overflowing down along the outer wall of the substrate 2. These benefits help prolong the reliability and useful working lifetime of the IC chip package.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. An IC (integrated circuit) chip package comprising:
a substrate comprising:
a top surface;
a bottom surface;
a receiving chamber defined therein, having an opening at the top surface;
a plurality of solder pads arranged around the top surface;
a plurality of solder pads arranged around the bottom surface, respectively corresponding to the solder pads arranged around the top surface; and
a plurality of vias defined therein, the vias having conductive material electrically connecting the top solder pads with the bottom solder pads;
a chip mounted in the receiving chamber of the substrate, the chip comprising a plurality of solder pads arranged around a top surface thereof;
a plurality of bonding wires respectively electrically connecting the top solder pads of the substrate and the solder pads of the chip, and areas where the bonding wires connect with the top solder pads of the substrate and the solder pads of the chip are covered with an adhesive; and
a cover fastened to the top surface of the substrate and covering the opening, the cover having a smaller profile than that of the substrate, a peripheral area of the top surface being not covered by the cover.

2. The IC chip package as claimed in claim 1, wherein the substrate comprises a board substrate, and a frame substrate mounted on top of the board substrate.

3. The IC chip package as claimed in claim 1, wherein an outer end of each top solder pad is spaced a distance from an outer wall of the substrate.

4. The IC chip package as claimed in claim 2, wherein the vias comprise a plurality of top via portions defined in the frame substrate, and a plurality of bottom via portions defined in the board substrate respectively communicating with the top via portions.

5. The IC chip package as claimed in claim 4, wherein the top via portions are aligned with the corresponding bottom via portions.

6. The IC chip package as claimed in claim 4, wherein each of the top via portions communicates with the corresponding bottom via portion via a respective intermediate via portion.

7. The IC chip package as claimed in claim 6, wherein the intermediate via portion is defined in a bottom surface portion of the frame substrate, or in a top surface portion of the board substrate, or in both the bottom surface portion of the frame substrate and the top surface portion of the board substrate.

8. The IC chip package as claimed in claim 6, wherein the intermediate via portion comprises a termination at an outer wall of the substrate.

9. The IC chip package as claimed in claim 1, wherein the bonding wires are covered with an adhesive.

10. A chip package comprising:
a substrate, the substrate comprising a top surface, a receiving chamber recessed from the top surface, and a plurality of pads disposed on the top surface, around the receiving chamber;
a chip received in the receiving chamber, the chip comprising a plurality of pads arranged on a top surface thereof;
a plurality of wires electrically connecting the pads of the chip to the pads of the substrate;
an adhesive applied on the top surface of the chip; and
a cover adhered to the adhesive.

11. The chip package as claimed in claim 10, wherein the pads of the chip are arranged on a peripheral region of the top surface, and the adhesive is applied on the peripheral region of the top surface of the chip to cover connections of the wires and the pads of the chip.

12. The chip package as claimed in claim 11, wherein the adhesive is further applied on the wires to protect the wires.

13. The chip package as claimed in claim 12, wherein the adhesive is further applied to the top surface of the substrate to cover connections of the wires and the pads of the substrate.

14. The chip package as claimed in claim 11, wherein the cover has an outer periphery smaller than that of the top surface of the substrate, and the adhesive is further applied to the sides of the cover and the top surface of substrate not covered by the cover.

15. The chip package as claimed in claim 14, wherein the substrate further comprises a plurality of pads arranged on a bottom surface thereof, and the pads on the bottom surface are electrically connected to the pads on the top surface of the substrate.

16. The chip package as claimed in claim 15, wherein the substrate further comprises a plurality of vias defined therein, and the vias electrically connect the pads on the bottom surface of the substrate to the pads on the top surface of the substrate.

17. A chip package comprising:
a substrate, the substrate comprising a receiving chamber defined in a top surface thereof, and a plurality of pads disposed on the top surface, around the receiving chamber;
a chip received in the receiving chamber, the chip comprising a plurality of pads arranged on a peripheral region of a top surface thereof;
a plurality of wires electrically connecting the pads of the chip with the pads of the substrate;
an adhesive applied on the wires and areas where the wires connect with the pads of the chip; and
a cover disposed above the chip, the cover being adhered to the adhesive.

18. The chip package as claimed in claim 17, wherein the cover covers the top surface of the substrate, and the adhesive is further applied to sides of the cover to attach the cover to the substrate and seal the receiving chamber.

* * * * *